United States Patent
Mundinger et al.

[11] Patent Number: 5,835,518
[45] Date of Patent: Nov. 10, 1998

[54] LASER DIODE ARRAY PACKAGING

[75] Inventors: David C. Mundinger; James Z. Holtz, both of Livermore; Robert E. Grove, Pleasanton, all of Calif.

[73] Assignee: Star Medical Technologies, Inc., Pleasanton, Calif.

[21] Appl. No.: 789,968

[22] Filed: Jan. 31, 1997

[51] Int. Cl.⁶ .................... H01S 3/18; H01S 3/04; H01S 3/19
[52] U.S. Cl. ................... 372/50; 372/43; 372/36
[58] Field of Search .................. 372/36, 43, 50, 372/101, 109, 75; 438/28; 359/708

[56] References Cited

U.S. PATENT DOCUMENTS

| | | | |
|---|---|---|---|
| 4,716,568 | 12/1987 | Scifres et al. | 372/36 |
| 4,881,237 | 11/1989 | Donnelly | 372/50 |
| 5,031,187 | 7/1991 | Orenstein et al. | 372/50 |
| 5,040,187 | 8/1991 | Karpinski | 372/50 |
| 5,128,951 | 7/1992 | Karpinski | 372/50 |
| 5,284,790 | 2/1994 | Karpinski | 438/28 |
| 5,305,344 | 4/1994 | Patel | 372/50 |
| 5,311,535 | 5/1994 | Karpinski | 372/50 |
| 5,357,536 | 10/1994 | Andrews | 372/50 |
| 5,420,722 | 5/1995 | Bielak | 359/708 |
| 5,526,373 | 6/1996 | Karpinski | 372/101 |

Primary Examiner—Phan T. H. Palmer
Assistant Examiner—Quyen P. Leung
Attorney, Agent, or Firm—Wolf, Greenfield & Sacks, P.C.

[57] ABSTRACT

A method of packaging laser diode arrays includes the steps of forming a submount array having a plurality of submounts and an element for maintaining a precise spacing between the submounts; bonding the submounts to a substrate formed of an electrically insulating material; removing the element maintaining the precise spacing; and placing a diode bar in each of the precise spacings between adjacent submounts. For one embodiment of the invention, the submount array is formed by providing a plurality of submounts and a removable spacer between each pair of adjacent submounts, which spacers may be fixtured and are removed after the submounts are bonded to the substrate. For a second embodiment, the submount array is formed by machining a block of material from which submounts are to be formed into a plurality of submounts joined to each other by at least one attachment structure. After the submounts have been bonded to the substrate, the attachment structures may be machined away of otherwise removed. For the second embodiment, the submount array may have additional structures which may be used for alignment, mounting or other functions and selected features, able for a variety of functions, may be formed in such additional structures or in the submounts. The additional structures are secured to the submount array by attachment structures. One or more of the additional structures may be bonded to the substrate and will remain on the substrate when the attachment structures are removed.

25 Claims, 6 Drawing Sheets

LASER DIODE ARRAY PACKAGING

FIELD OF THE INVENTION

This invention relates to the packaging of laser diode bars into arrays and more particularly to improved methods for packaging laser diode bars into arrays, to components suitable for use in practicing such methods, and to unique laser diode arrays achieved through use of such methods and components.

BACKGROUND OF THE INVENTION

Laser diode arrays (i.e., arrays of laser diode bars) are being increasingly utilized in applications such as material processing, solid state laser pumping, and various medical applications. In order to produce such laser diode arrays, two approaches have heretofore been utilized. The first involves the attachment of diode bars to submounts to form individual subassemblies and the stacking together of these individual subassemblies to create a diode array. The second approach involves sawing grooves in a monolithic ceramic or composite material, appropriately metalizing the ceramic and then soldering the bars into the monolithic structure (See, for example U.S. Pat. No. 5,040,187).

The first of these approaches allows the use of both electrically conducting and insulating materials for the submounts, as well as design flexibility in the shape and size of the submounts. However, because in this approach the submounts are individual elements prior to bonding to a substrate, it is very difficult to ensure that the submounts are all parallel to each other and precisely spaced. In addition the assembly of the array is more laborious.

The second approach allows more precise location of the individual grooves into which the laser diode bars are placed and permits arrays to be fabricated with relative ease and at low cost. This approach suffers, however, from the constraint that the monolithic material in which the grooves are sawed must be non-electrically conducting (if the grooves were cut in a conducting material, electrical current would pass through the material instead of through the laser diode bars placed in the grooves). In addition, the insulating material must be coated with a conducting material within the grooves to allow electrical contact with the laser bar.

While an array of grooves cut into a material consisting of a metal layer on top of a ceramic substrate has been proposed (U.S. Pat. No. 5,128,951), this approach has not been practically implemented.

A need therefore exists for an improved laser diode packaging method which combines the flexibility of material use and submount size of the first approach with the precision and ease of fabrication of the second approach.

Another highly desirable feature would be a fabrication/packaging method that would facilitate the use of precision microlenses. For a number of applications where higher brightness arrays are desired, an array of microlenses has been used in conjunction with the laser diode array. In order to obtain low beam divergence from the array, the individual microlenses must be precisely aligned with the diode array. Some developers have individually aligned microlenses to each bar in the array, while others have first constructed an array of microlenses and then aligned the microlens array to the array of diode bars. The first approach, while highly accurate, is time consuming and expensive to implement. The second approach, while considerably less expensive, requires that both the array of bars and the array of microlenses be precisely fabricated and precisely aligned with respect to each other. Similar requirements for precision mounting and/or alignment coupled with low cost fabrication exist for other components utilized with laser diode arrays.

SUMMARY OF THE INVENTION

In accordance with the above, this invention provides a method of packaging a laser diode array which includes the steps of forming a submount array having a plurality of submounts and an element for maintaining a precise spacing between the submounts; bonding the submounts to a substrate formed of an electrically insulating material; removing the elements maintaining the precise spacing; and placing a diode bar in each of the precise spacings between adjacent submounts. For one embodiment of the invention, the submount array is formed by providing a plurality of submounts and positioning a removable spacer between each pair of adjacent submounts, the spacers being the elements for maintaining the precise spacing. The submounts can either be formed of an electrically and thermally conducting material or can be formed of an electrically insulating, thermally conducting material, with the surface of the submounts which contacts the diode bars being metalized. The spacers employed in this embodiment are preferably interconnected to form a fixture.

For a second embodiment, the submount array is formed by machining a block of material from which submounts are to be formed into a plurality of submounts joined to each other with at least one attachment structure, the attachment structures functioning as the elements for maintaining a precise spacing. After the submounts have been bonded to the substrate, the attachment structures may be machined away or otherwise removed.

For some embodiments, the laser diode array includes a plurality of adjacent laser diode subarrays, with an attachment structure between each adjacent subarray. For this embodiment, the submounts of all subarrays are bonded to the substrate and all attachment structures are then removed.

Additional structures and/or selected features may be machined into the blocks in addition to the submounts and attachment structures and at least selected ones of the additional structure may be bonded to the substrate. The selected features may include special shapes, cutouts, slots and/or grooves to which other parts with complimentary shapes may mate. The method may also include the step of utilizing at least some of the additional structures and/or features to align and mount a microlens array.

The bonding of submounts to the substrate may be accomplished for example by metalizing the substrate in areas to which submounts are to be attached and soldering the submounts in place or by gluing the submounts to the substrate. The diode bars placed in the spacings between adjacent submounts are preferably soldered to the submounts.

The foregoing and other objects, features and advantages of the invention will be apparent from the following more particular description of preferred embodiments of the invention as illustrated in the accompanying drawings.

IN THE DRAWINGS

FIG. 4 is a top perspective view illustrating the fabrication of a modified laser diode array at the same stage shown in FIG. 3a;

DETAILED DESCRIPTION

Figure 1A:
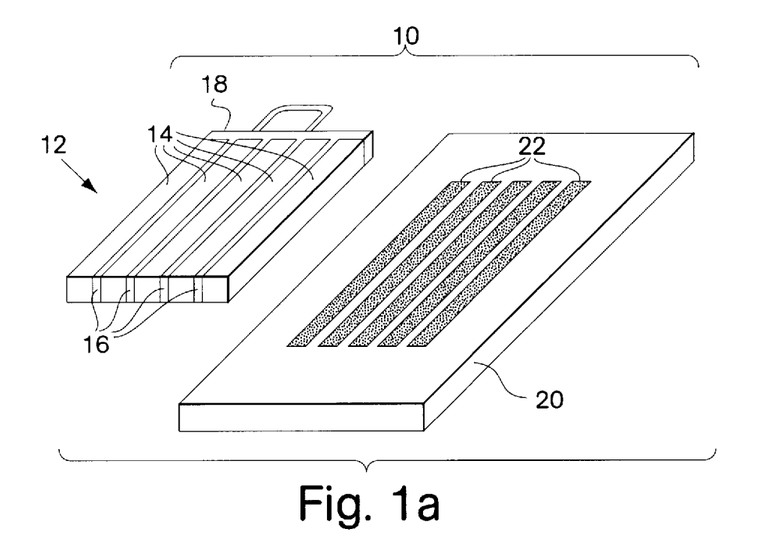
FIG. 1a is a partially exploded top perspective view of a laser diode array at a preliminary stage in its fabrication in accordance with a first embodiment of the invention.
Figure 1B:
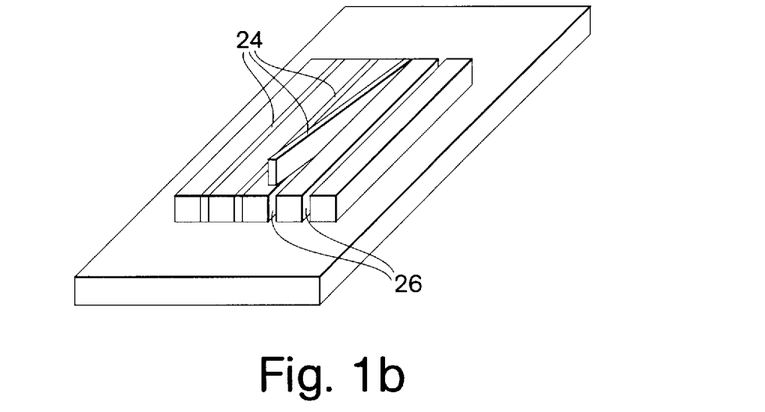
FIG. 1b is a top perspective view of a laser diode array illustrating further intermediate stages in the fabrication thereof in accordance with the first embodiment.

Referring to FIGS. 1a and 1b, the array 10 is formed by initially forming a submount array 12 consisting of a plurality of individual submounts 14 which are maintained with a precise spacing therebetween by removable spacers 16 which, for the embodiment shown in FIG. 1a, are formed into a fixture 18. A substrate 20 of an electrically insulating material is either metalized or has glue applied thereto in areas 22. Submount assembly 12 is then mounted on substrate 20 and the submounts 14 bonded to areas 22. If the areas 22 have been metalized, this bonding is preferably accomplished by soldering. Otherwise, the bonding may be accomplished by gluing or other suitable techniques known in the art.

Once the bonding of the submounts to substrate 20 has been effected, spacers 16 may be removed, for example by manually removing fixture 18. Where a fixture 18 is not employed, the submounts may be individually removed. After the spacers are removed, diode bars 24 (FIG. 1b) are placed in grooves 26 vacated by spacers 16. The diodes are then preferably soldered in place. The choice of submount material depends on the desired characteristics and intended use of the diode array. In the case of a conducting material, copper, silver or copper-tungsten are preferred materials. Copper and silver both have very good thermal conductivity and excellent solderability. Copper-tungsten, on the other hand, has a better thermal expansion match to the diode bar substrate material, but has a lower value of thermal conductivity and must be plated prior to soldering. In the case of a ceramic material, beryllium oxide, cubic boron nitride, and aluminum nitride are preferred materials. Beryllium oxide and cubic boron nitride have excellent thermo-mechanical properties, but beryllium oxide is toxic and cubic boron nitride reacts at elevated temperature. Aluminum nitride does not have these shortcomings, but has somewhat inferior thermo-mechanical properties. In the case of ceramic materials, the submounts must be metalized prior to bonding to the substrate.

The above method can provide very narrow submounts and submounts of varying width within the same assembly. Individual submounts within the same array can also be made from differing material.

As an example of the embodiments of FIGS. 1a and 1b, an aluminum nitride substrate 1 cm by 1 cm by 0.05 cm in size is used. Individual submounts 0.1 cm by 0.09 cm by 1 cm are electric discharge machined out of copper. The substrate is metalized using a shadow mask to create a series of metal stripes 0.08 cm by 1 cm in size and 0.1 cm. on centers, using a coating of titanium, nickel and gold. Ten submounts with 0.1 mm stainless steel spacers between them are then placed on the substrate and aligned to the metalization pattern. The submounts are then soldered to the ceramic and the stainless steel spacers are removed. Nine diode bars are then placed within the nine spaces between the individual submounts and soldered in place to create the laser diode array.

Figure 2:
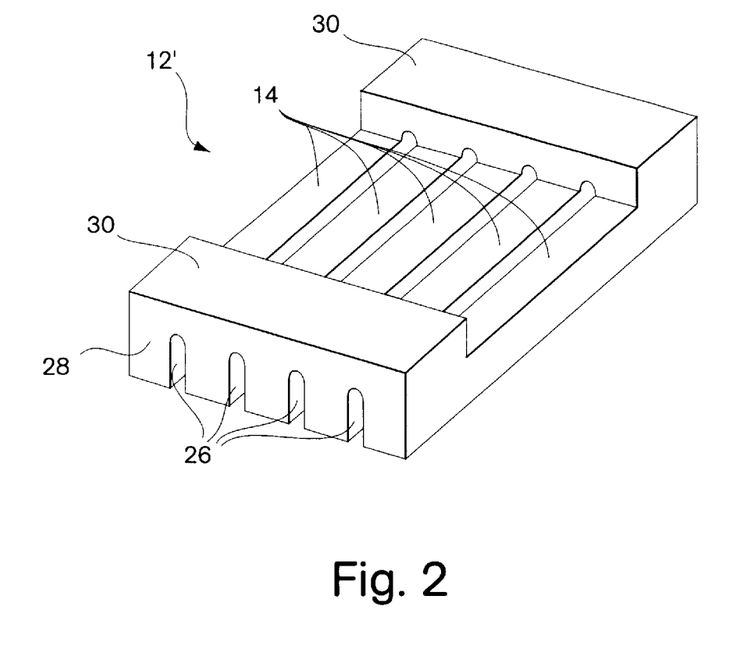
FIG. 2 is a top perspective view of a component suitable for use in fabricating a laser diode array in accordance with a second embodiment of the invention.
Figure 3A:
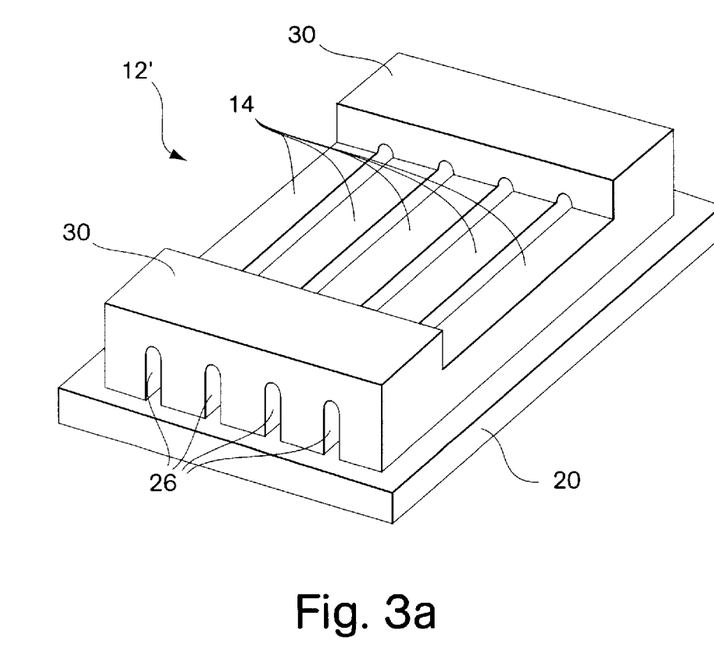
FIGS. 3a and 3b are top perspective views illustrating two different stages in the fabrication of a laser diode array in accordance with the second embodiment of the invention.
Figure 3B:
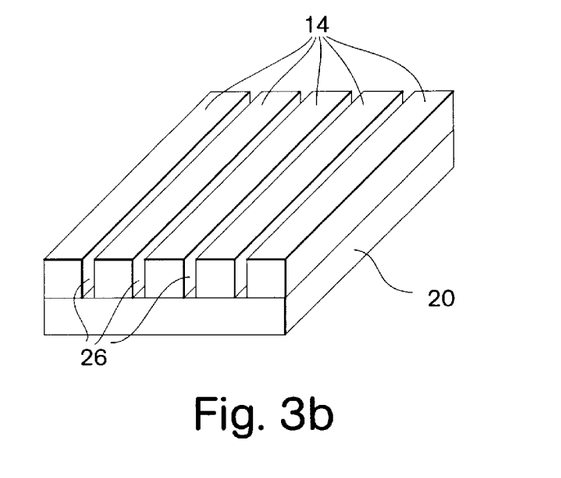

FIGS. 2, 3a and 3b illustrate the basic concept for a second embodiment of the invention. For this embodiment, the submount assembly 12' is a block of material from which submounts are fabricated, which material may, as discussed earlier, be a conducting material or a ceramic. Submounts 14 are partially cut or otherwise machined out of the block with spaces 26 being left between the submounts. Spaces 26, as for the previous embodiment, are of adequate width to accommodate diode bars 24. The submounts 14 are completely cut except for regions of attachment or attachment structures 30, which structures hold the submounts rigidly together and maintain their spacing and alignment with respect to each other.

As illustrated in FIG. 3a, the machined block 28 is then mounted on substrate 20, which substrate may be previously metalized as shown in FIG. 1a, with the surface of the block opposite that containing attachment structures 30 being in contact with the substrate, and the submounts are then bonded to substrate 20 in the same manner discussed previously for the first embodiment of the invention. Attachment structures 30 are then removed by lapping or other suitable techniques of machining, leaving the submounts 14 mounted on substrate 20 with spaces 26 between the submounts as shown in FIG. 3b. Diode bars 24 may then be mounted in the spaces 26 and soldered therein as for the previous embodiment. Also, as with the previous embodiment, if the submounts 14 are formed of a ceramic or other nonconducting material, the submounts must be metalized, at least in the area of spaces 26, either before or after mounting, to substrate 20.

Figure 4:
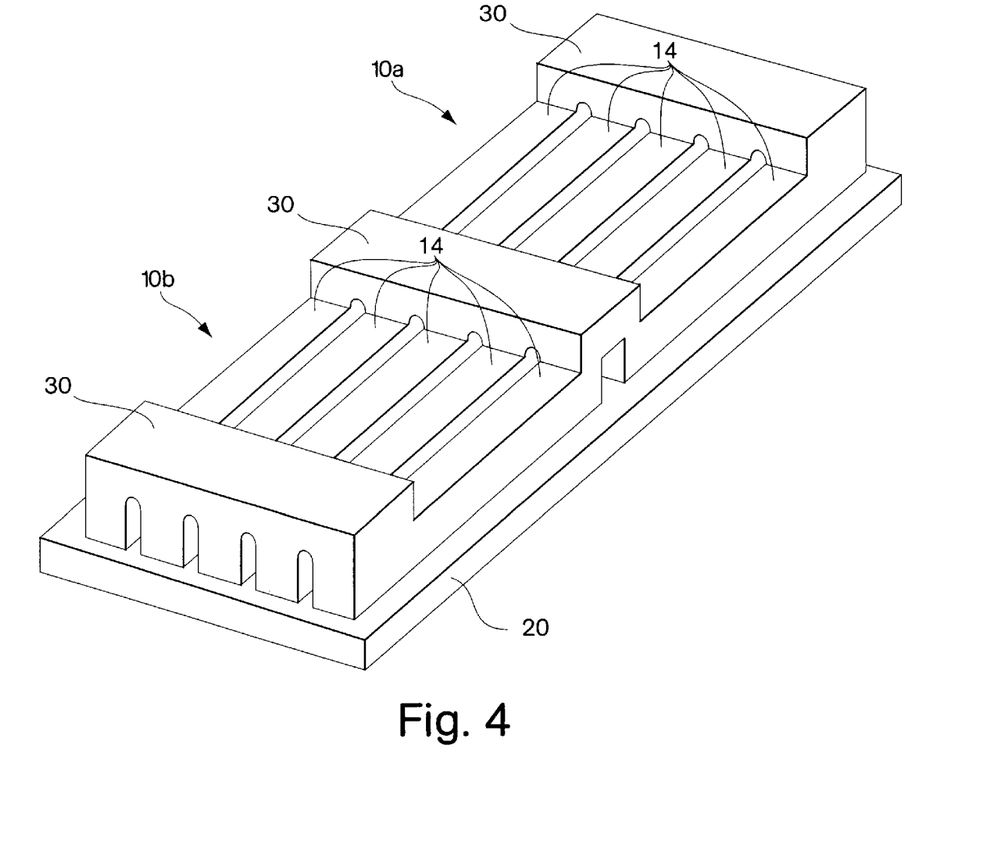
Figure 5:
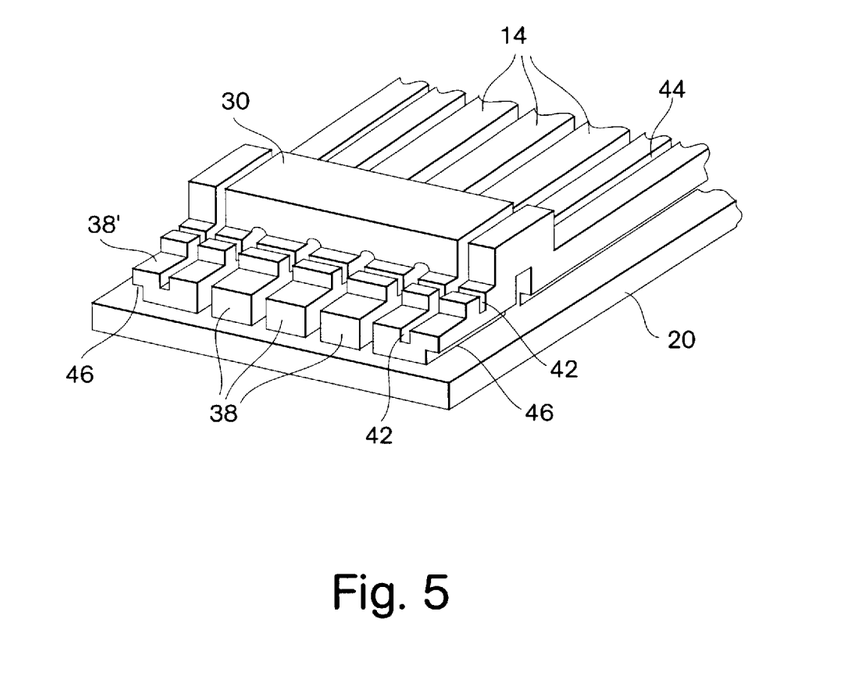
FIG. 5 is a partial top perspective view of another alternative embodiment of the invention illustrated at the same stage of fabrication as shown in FIG. 4.

FIG. 4 illustrates the invention being extended to laser diode arrays in which bars are stacked end to end. In FIG. 4, two arrays, 10a, 10b, are machined out of a single block, with submounts 14 for both arrays being held in place by attachment structures 30. In this case, the center attachment structure functions both to maintain positions for the submounts of both arrays and to maintain the desired relative position between the arrays during the mounting operation. Once the arrays have been bonded to substrate 20, attachment structures 30 are removed by lapping or other suitable machining technique.

Figure 6:
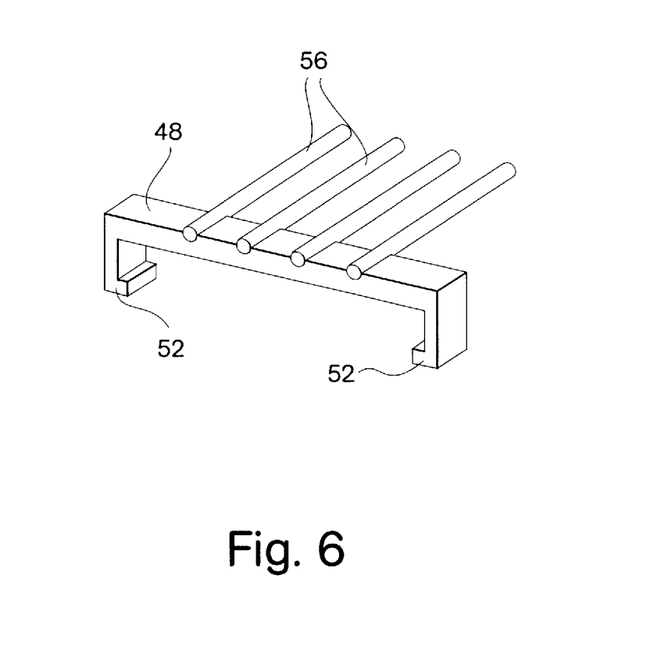
FIG. 6 is a top perspective view of a complimentary part suitable for use with the laser diode array shown in FIG. 5.

As illustrated in FIGS. 5–8, the teachings of this invention can be expanded to provide additional structures and features which may be formed in a block 28, which additional structures and/or features may be utilized for alignment, mounting and other functions. More specifically, referring to FIG. 5, alignment structures 38 are provided on each end of the assembly. The alignment structures which are machined out of the same block 28 as the submounts 14, extend for the embodiment shown in FIG. 5 from each end of the array and are held in place by the same attachment structures 30 as the submounts. All of the structures 38 may be bonded to substrate 20 or, for example, metalizing layers 22 may be omitted under certain of the structures 38 so that these structures are not bonded to the substrate and may be removed after attachment structures 30 are machined away. Various features, such as special shapes, cutouts, slots and grooves, may also be machined into various ones of the structures 38 and/or mounts 14. For example, end structure 38' in FIG. 5 may be higher than the remaining structures for mounting purposes (for example to set the focal distance for microlenses). Slots 42 may also be formed in various directions in the structures and slots 44 may also be formed in submounts. More complicated structures such as cutouts 46 may also be machined into the structures. These features can be utilized for example to mate other parts having complimentary shapes with the laser diode array. For example, FIG. 6 illustrates a bracket 48 supporting microlenses 50 which bracket has projections 52 adapted to fit into cutouts 46 to precisely align and position the microlens array 50 relative to the laser diode array.

As with the packaging method of FIGS. 1a and 1b, the packaging technique described above can be used to create very narrow submounts and submounts of varying width within the same assembly. Further, the structure can be custom machined to, for example, correct for pitch errors in a microlens array or to otherwise compensate for small errors in other components with which the laser diode array is to mate.

Figure 7A:
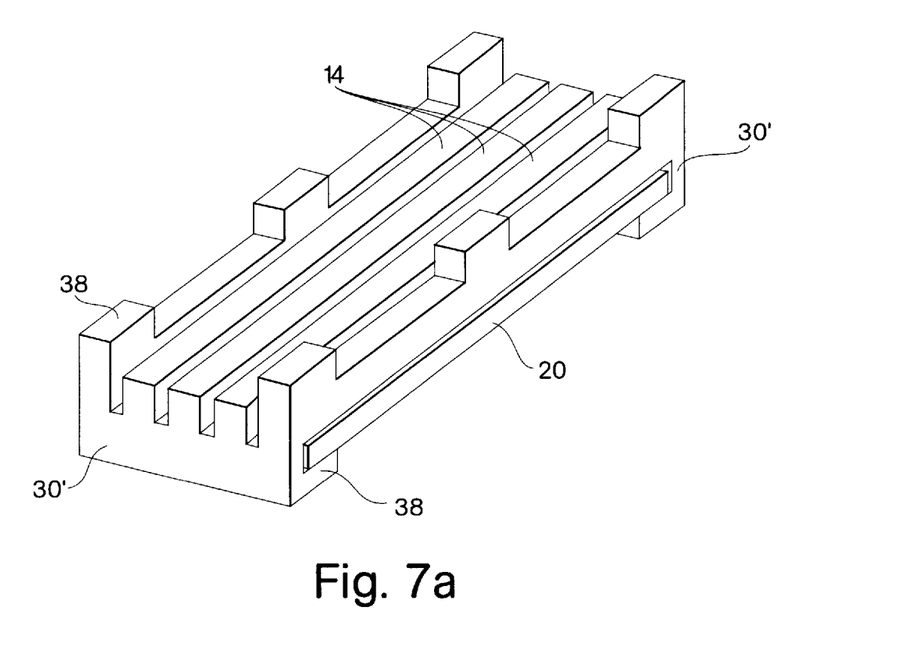
FIGS. 7a and 7b are top perspective views of still another embodiment of the invention shown at two different stages in the fabrication process.
Figure 7B:
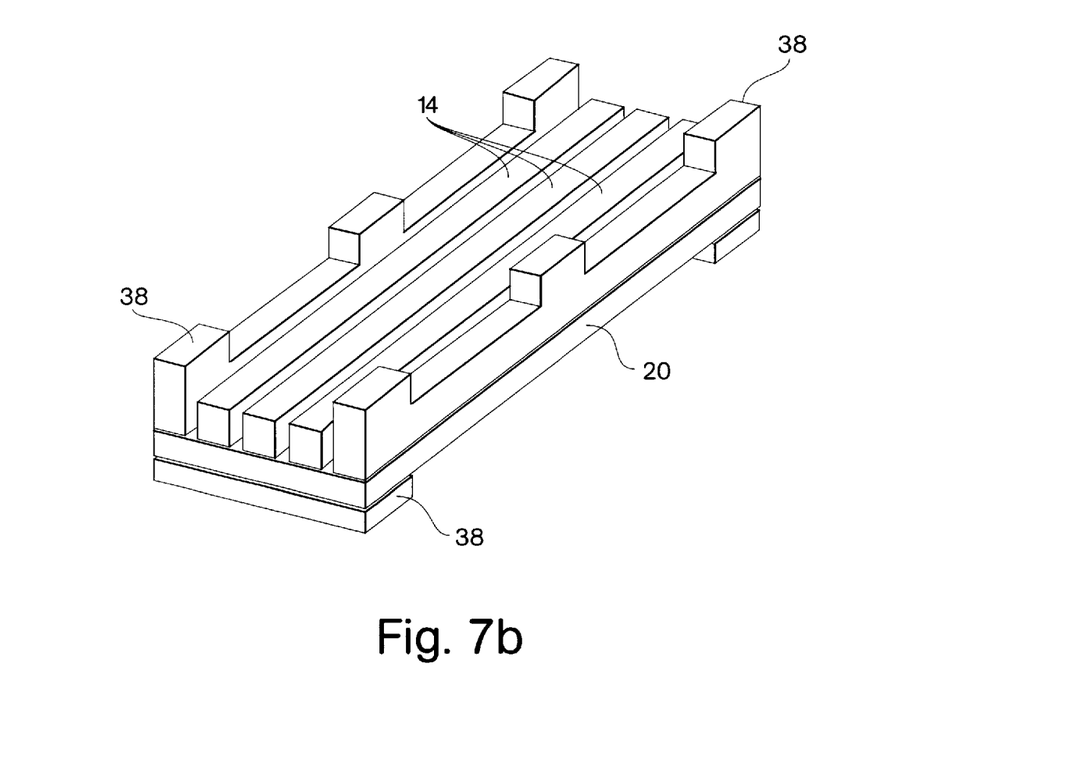

While for the embodiments previously described, the attachment structures 30 extend above the substrate and the various additional alignment or other structures 38 extend from the end of the array, FIGS. 7a and 7b illustrate alternative configurations and the placement of these various structures. In particular, in FIG. 7b, after the attachment structures 30' have been removed, various structures 38 remain both projecting above the array and extending below substrate 20 (i.e., extending both above and below the plane of the submounts).

Figure 8:
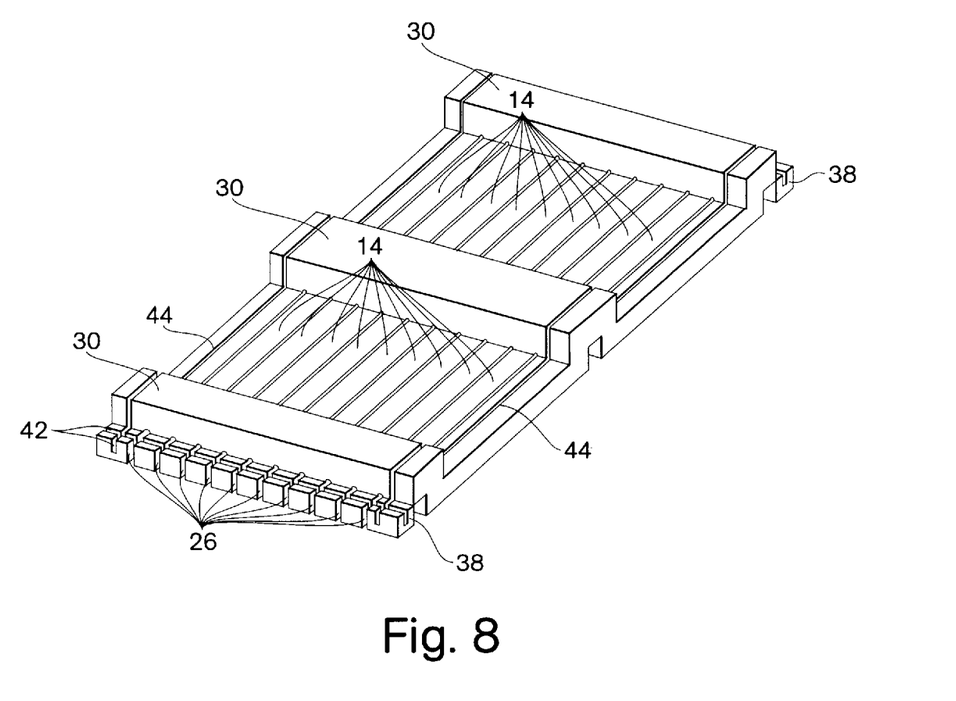
FIG. 8 is a top perspective view of a component suitable for use in the fabrication of a laser diode array in accordance with the method of the second embodiment for still another laser array configuration.

FIG. 8 illustrates the packaging technique of this invention being applied to the fabrication of a microlensed twenty-bar diode array. For this embodiment, the starting material is a block of copper-tungsten. The block is electric discharge machined to create the part shown in FIG. 8. Ten grooves 26 are cut into the copper-tungsten with a width which is slightly larger than the thickness of the diode bars (not shown). The submounts 14 are cut to be approximately equal in length to the diode bars. Outrigger structures 38 located at either end of the arrays are also cut or machined into the block. Additional grooves 42 are cut into the outrigger structures 38 and additional grooves 44 are cut in the end submounts. These grooves allow the insertion of metal shim stock which serves to align a microlens array to the array of laser bars. The submounts and outrigger structures are attached to one another by attachment structures 30. The machined part shown in FIG. 8 is then metalized and soldered to the ceramic substrate 20 which has been metalized with a pattern matched to that of the submounts and the desired outrigger structures. The completed assembly is then lapped to leave behind the individual submounts and desired outrigger structures. For an illustrative embodiment, only the submounts 14 and the four corner outrigger structures 38 remain attached. After the part is lapped to remove structures 30, laser diode bars are soldered into slots 26 and a microlens array consisting of optical elements with precisely aligned metal shims which mate to the alignment grooves 42 and 44 is mounted and secured in place.

While the invention has been shown and described above with respect to specific laser diode arrays and specific additional structures and features, it is apparent that the invention is in no way limited to these specific arrays, structures and features, and that the teachings of this invention may be utilized to package/fabricate a wide range of laser diode array structures. Further, while specific spacers have been shown for the first embodiment, specific submount arrays for both embodiments and specific techniques disclosed for performing various functions for the embodiments, all these are for purposes of illustration, and other spacers, including individual spacers, submount arrays and techniques for performing the various operations may be employed. For example, while the attachment structures 30 for the embodiments shown in FIGS. 2–8 are at both ends of the submounts, this is not a limitation on the invention and other locations for the attachment structures are possible for selected applications. For example, it may be possible in some applications to have a single attachment structure for the embodiment of Fib. 2 located near the center of the submounts 14 or, for the embodiment of Fib. 4, to have only the center attachment structure and eliminate the two end attachment structures. Thus, while the invention has been particularly shown and described above with reference to preferred embodiments, the foregoing and other changes in form and detail may be made therein by those skilled in the art without departing from the spirit and scope of the invention.

What is claimed is:

1. A method of packaging a laser diode array comprising the steps of:
   a) forming a submount array having a plurality of submounts and an element for maintaining a precise spacing between the submounts;
   b) bonding the submounts to a substrate formed of an electrically insulating material;
   c) removing said elements; and
   d) placing a diode bar in each of the precise spacings between adjacent submounts.

2. A method as claimed in claim 1 wherein step (a) includes the steps of providing the plurality of submounts, and positioning a removable spacer between each pair of adjacent submounts, the spacers being said element for maintaining a precise spacing.

3. A method as claimed in claim 2 wherein said submounts are formed of an electrically and thermally conductive material.

4. A method as claimed in claim 2 wherein said submounts are formed of an electrically insulating, thermally conductive material, and wherein step (a) includes the step of metalizing the submounts.

5. A method as claimed in claim 2 wherein there are variations in at least one of the size and the material for said submounts.

6. A method as claimed in claim 2 wherein said spacers are interconnected to form a fixture.

7. A method as claimed in claim 2 wherein step (c) includes the step of removing the spacers from between the submounts.

8. A method as claimed in claim 1 wherein step (b) includes the steps of metalizing said substrate in areas to which said submounts are to be attached, and soldering the submounts in place.

9. A method as claimed in claim 1 wherein step (b) includes the step of gluing the submounts to the substrate.

10. A method as claimed in claim 1 wherein step (d) includes the step of soldering the diode bars to the submounts.

11. A method as claimed in claim 1 wherein step (a) includes the step (e) of machining a block of material from which submounts are to be formed into the plurality of submounts joined to each other by at least one attachment structure which function as said element.

12. A method as claimed in claim 11 wherein step (c) includes the step of machining away said at least one attachment structure.

13. A method as claimed in claim 11 wherein said attachment structures are at each end of said submounts.

14. A method as claimed in claim 11 wherein said laser diode array includes a plurality of adjacent laser diode subarrays, and wherein step (e) includes the step of machining the block of material to form the plurality of submounts for each subarray, said at least one attachment structure attaching the submounts of each array and adjacent subarrays;

wherein during step (b) the submounts for all subarrays are bonded to the substrate; and wherein during step (c) all the attachment structures are removed.

15. A method as claimed in claim 11 wherein step (e) includes machining alignment structures into said block in addition to the submount and attachment structures.

16. A method as claimed in claim 11 wherein step (e) includes machining selected features into selected portions of the block.

17. A method as claimed in claim 16 wherein said selected features include at least one of special shapes, cutouts, slots and grooves to which other parts with complementary shapes may mate.

18. A method as claimed in claim 17 including the step of utilizing at least some of said features to align and mount a microlens array.

19. A laser diode array packaged in accordance with the method of claim 1.

20. A component for use in packaging a laser diode array comprising:

a block of a thermally conductive material machined to form a submount array having a plurality of adjacent submounts, at least one attachment structure interconnecting adjacent submounts and maintaining a precise spacing therebetween, and additional structures machined into said block in addition to said submounts and attachment structures, which additional structures are at least one of alignment structures and mounting structures.

21. A component as claimed in claim 20 including at least one of mounting shapes, cutouts, slots and grooves machined into said block.

22. A component for use in packaging a laser diode array comprising:

a block of a thermally conductive material machined to form a submount array having a plurality of adjacent submounts, which submounts are not all of the same thickness, with at least one attachment structure interconnecting adjacent submounts and maintaining a precise spacing therebetween.

23. A laser diode array comprising:

a substrate formed of an electrically insulating material;

a plurality of adjacent submounts bonded to said substrate, each pair of adjacent submounts being separated by a precise spacing;

a diode bar in each said precise spacing; and at least one structure for performing at least one of an alignment and a mounting function bonded to said substrate adjacent said submounts.

24. A laser diode array as claimed in claim 23 including selected features formed in at least one of said structures and said submounts.

25. A laser diode array as claimed in claim 24 wherein said special features are at least one of special shapes, cutouts, slots and grooves to which other parts with complementary shapes may mate.

* * * * *